(12) United States Patent
Lee

(10) Patent No.: US 12,684,713 B2
(45) Date of Patent: Jul. 14, 2026

(54) VEHICULAR SENSOR DEVICE

(71) Applicant: HYUNDAI MOBIS CO., LTD., Seoul (KR)

(72) Inventor: Sang Gwon Lee, Yongin-si (KR)

(73) Assignee: Hyundai Mobis Co., Ltd., Seoul (KR)

( * ) Notice: Subject to any disclaimer, the term of this patent is extended or adjusted under 35 U.S.C. 154(b) by 170 days.

(21) Appl. No.: 18/382,597

(22) Filed: Oct. 23, 2023

(65) Prior Publication Data

US 2024/0314948 A1     Sep. 19, 2024

(30) Foreign Application Priority Data

Mar. 14, 2023     (KR) ........................ 10-2023-0033120

(51) Int. Cl.
| | |
|---|---|
| *H05K 5/02* | (2006.01) |
| *G01S 7/02* | (2006.01) |
| *H05K 5/03* | (2006.01) |
| *H05K 7/14* | (2006.01) |

(52) U.S. Cl.
CPC ............ *H05K 5/0217* (2013.01); *G01S 7/028* (2021.05); *H05K 5/03* (2013.01); *H05K 7/1427* (2013.01)

(58) Field of Classification Search
USPC ........................................................ 361/807
See application file for complete search history.

(56) References Cited

U.S. PATENT DOCUMENTS

| | | | | |
|---|---|---|---|---|
| 4,212,415 | A * | 7/1980 | Neely .................... | B65D 11/10 222/231 |
| 6,366,465 | B1 * | 4/2002 | Baur ...................... | H05K 7/142 361/752 |
| 6,606,252 | B1 * | 8/2003 | Snider .................. | H05K 1/0268 174/262 |
| 7,072,188 | B2 * | 7/2006 | Janisch ............... | B60R 16/0239 361/833 |
| 7,649,731 | B2 * | 1/2010 | Parrish ............... | B60R 16/0238 361/624 |
| 2003/0184988 | A1 * | 10/2003 | Boyd .................. | H01H 85/2045 361/833 |
| 2006/0044776 | A1 * | 3/2006 | Xu .......................... | G06F 1/184 361/803 |
| 2006/0223347 | A1 * | 10/2006 | Kim ........................ | H05K 5/02 439/95 |
| 2013/0163216 | A1 * | 6/2013 | Sun .......................... | H05K 7/12 361/759 |
| 2017/0098523 | A1 * | 4/2017 | Schwartz ............ | B60R 16/0238 |
| 2018/0003754 | A1 * | 1/2018 | Schrattenecker .. | G01R 31/2822 |
| 2021/0372645 | A1 * | 12/2021 | Harder ..................... | F24F 11/52 |

FOREIGN PATENT DOCUMENTS

| | | | | |
|---|---|---|---|---|
| CN | 203536535 U | * | 4/2014 | ............ H01M 10/42 |
| KR | 10-2021-0141056 A | | 11/2021 | |

* cited by examiner

*Primary Examiner* — Hung S. Bui
(74) *Attorney, Agent, or Firm* — Morgan, Lewis & Bockius LLP

(57) ABSTRACT

The present disclosure relates to a vehicular sensor device, the vehicular sensor device including a housing having an opening and having an internal space inside, a substrate accommodated inside the housing, a detector mounted on the substrate, a cover coupled to the housing and covering the opening, and a sealing unit arranged between the cover and the housing.

11 Claims, 5 Drawing Sheets

DETECTION AREA

VEHICULAR SENSOR DEVICE

CROSS-REFERENCE TO RELATED APPLICATION

This application claims the benefit of priority under 35 USC § 119(a) to Korean Patent Applications No. 10-2023-0033120, filed on Mar. 14, 2023, the entire disclosure of which is incorporated herein by reference for all purposes.

TECHNICAL FIELD

Exemplary embodiments relate to a vehicular sensor device and, more particularly, to a vehicular sensor device capable of improving watertightness.

BACKGROUND

With the advent of new technologies for autonomous traveling, sensors, such as a radar, a lidar, and a camera, have expanding fields of use and an expanding range of applications for an increase in safety and convenience. Accordingly, there is a trend toward an increase in the number of sensors that are installed in a vehicle.

The sensors installed in the vehicle are mounted inside a casing and thus are protected from an external force. Usually, the casing that protects the sensor is structurally separated into at least two parts in a manner that can be assembled together.

In the related art, for the purpose of securing the watertightness of the casing in which the sensor is accommodated, a gasket is arranged before the casing is assembled, and then the casing is assembled using a bolt. However, there is a problem in that work-hours are spent when the bolt is fastened to the casing and that manufacturing costs increase with the number of bolts that are used. Since the gasket is assembled with the casing in a bolt-fastening manner, pressure is continuously applied to a local portion of the gasket. Thus, there is also a problem in that the lifetime of the gasket is shortened and that the watertightness decreases.

The related art of the present disclosure is disclosed in Korean Patent Application Publication No. 10-2021-0141056 (published on Nov. 23, 2021 and entitled "Radar Device for Vehicle").

SUMMARY

Various embodiments, which are contrived to find a solution to the above-mentioned problems, are directed to a vehicular sensor device capable of improving watertightness.

These embodiments are also directed to a vehicular sensor device capable of reducing manufacturing costs and work-hours and increasing the expected lifetime thereof.

In order to accomplish the above-mentioned objects, in an embodiment, a vehicular sensor device including: a housing having an opening and an internal space inside; a substrate accommodated inside the housing; a detector mounted on the substrate: a cover coupled to the housing and covering the opening; and a sealing unit arranged between the cover and the housing.

A hook may be protrusively formed on an outer surface of the housing, and a coupler may be coupled to the cover by being inserted thereinto.

The coupler may include a coupling body in which a through-hole into which the hook is inserted is formed, the coupling body being provided on an edge of the cover; and a blocking portion onto which the hook that is inserted into the through-hole is hooked, the blocking portion being provided on one side of the coupling body.

A plurality of hooks may be arranged along a circumference of the housing, and a plurality of couplers may be arranged along a circumference of the cover.

One or more fusion-subject protrusions may protrude upward on the housing, and one or more coupling holes of the substrate may be positioned corresponding to the fusion-subject protrusions.

The detector may be a radar sensor or a camera sensor.

A seating part may be formed along an edge of an inner surface of the cover by recessing thereinto, and the sealing unit may be seated on an inner side of the seating part.

The sealing unit may be O-ring formed of an elastic material in the shape of a ring.

The sealing unit may be pressed between the seating part and an edge of the housing.

One or more ribs may be protrusively formed on a surface of the seating part to press against the sealing unit.

A plurality of ribs may be arranged along the surface of the seating part.

The vehicular sensor device may further include; a label attached on an outer surface of the cover; and a base plate having a central hole, the housing being seated on the base plate and the base plate being coupled to the cover.

According to the present disclosure, the housing and cover are couped in a snap-fit manner instead of in a bolt fastening manner. As a result, manufacturing costs decrease with the number of bolts that used, and work-hours can be reduced when compared to fastening performed using a bolt in the related art.

According to the present disclosure, the housing and the cover are assembled together with the sealing unit in the shape of an O-ring interposed between them instead of using a gasket as in the related art. Thus, the sealing unity is pressed in all directions, thereby relieving local stress thereon and increasing the expected lifetime thereof for waterproofing.

DETAILED DESCRIPTION

Figure 1:
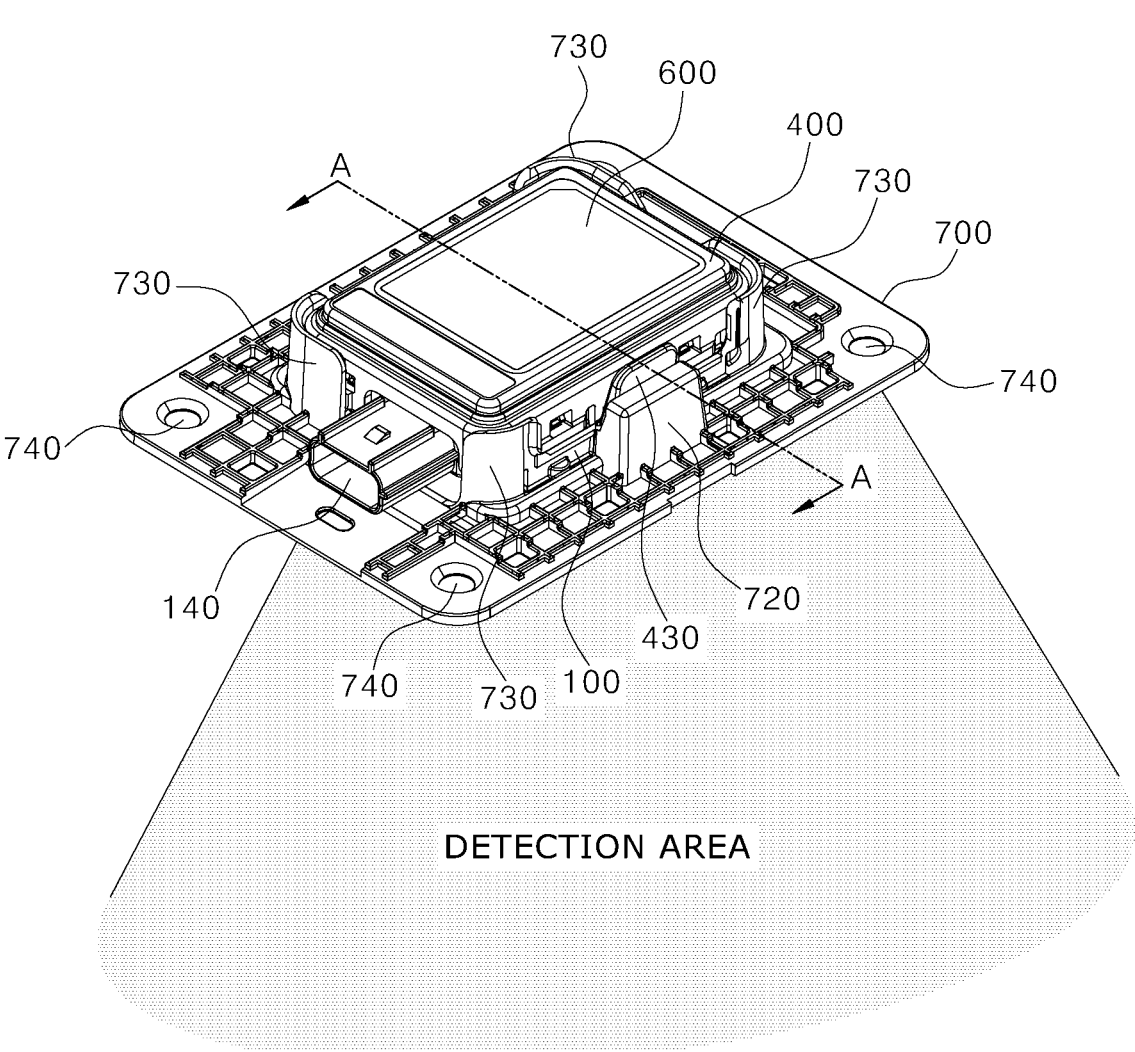
FIG. 1 is a perspective view illustrating a vehicular sensor device according to an embodiment of the present disclosure, when viewed from the outside.

A vehicular sensor device according to an embodiment of the present disclosure will be described with reference to the accompanying drawings. For clarity and convenience in description, thicknesses of lines, sizes of constituent elements, and the like may be illustrated in a non-exact proportion in the drawings. In addition, terms that hereinafter refer to constituent elements, respectively, according to the present disclosure are defined by considering their respective functions and may vary according to a user's or manager's intention or to practices in the art. Therefore, these terms should be contextually defined in light of the present specification.

Figure 2:
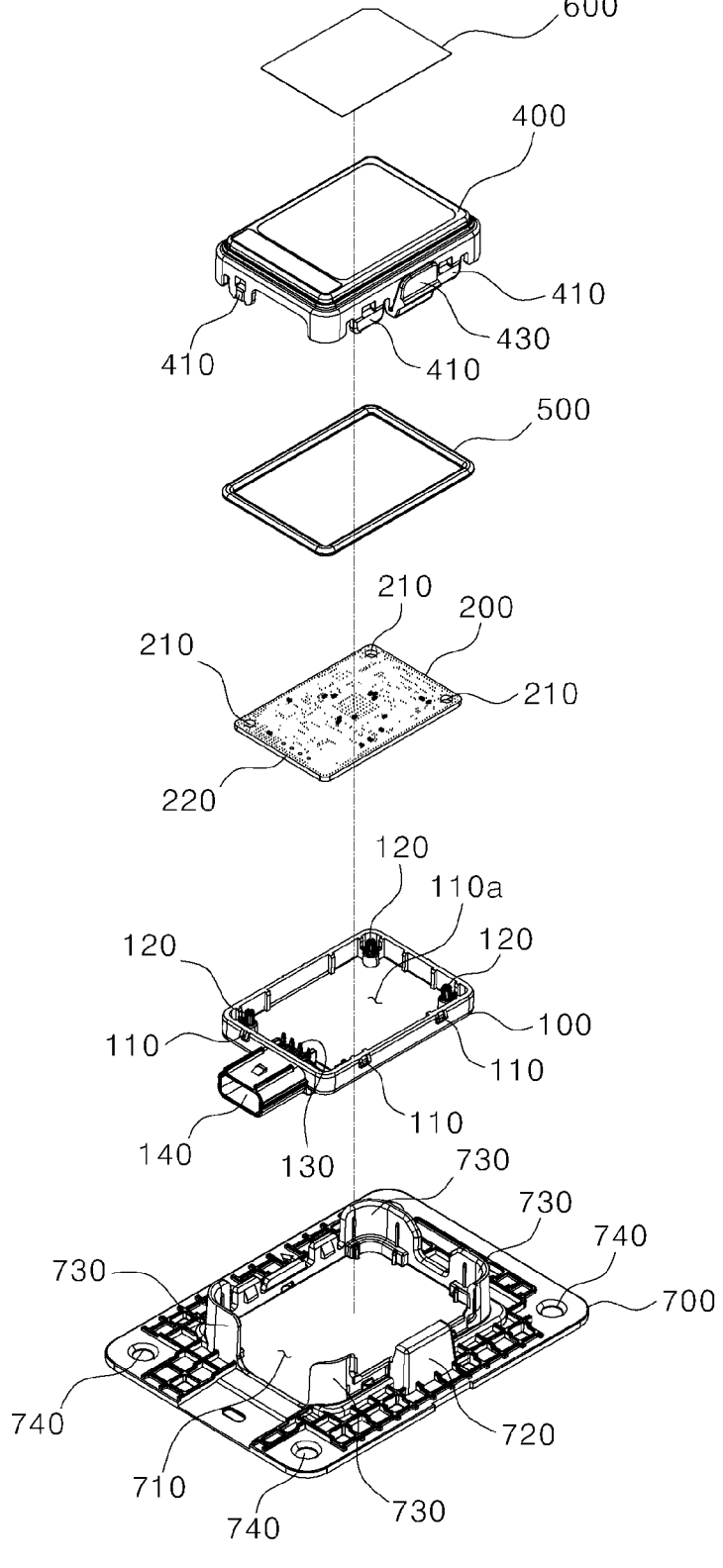
FIG. 2 is an exploded perspective view illustrating the vehicular sensor device according to the embodiment of the present disclosure, when viewed from above.
Figure 3:
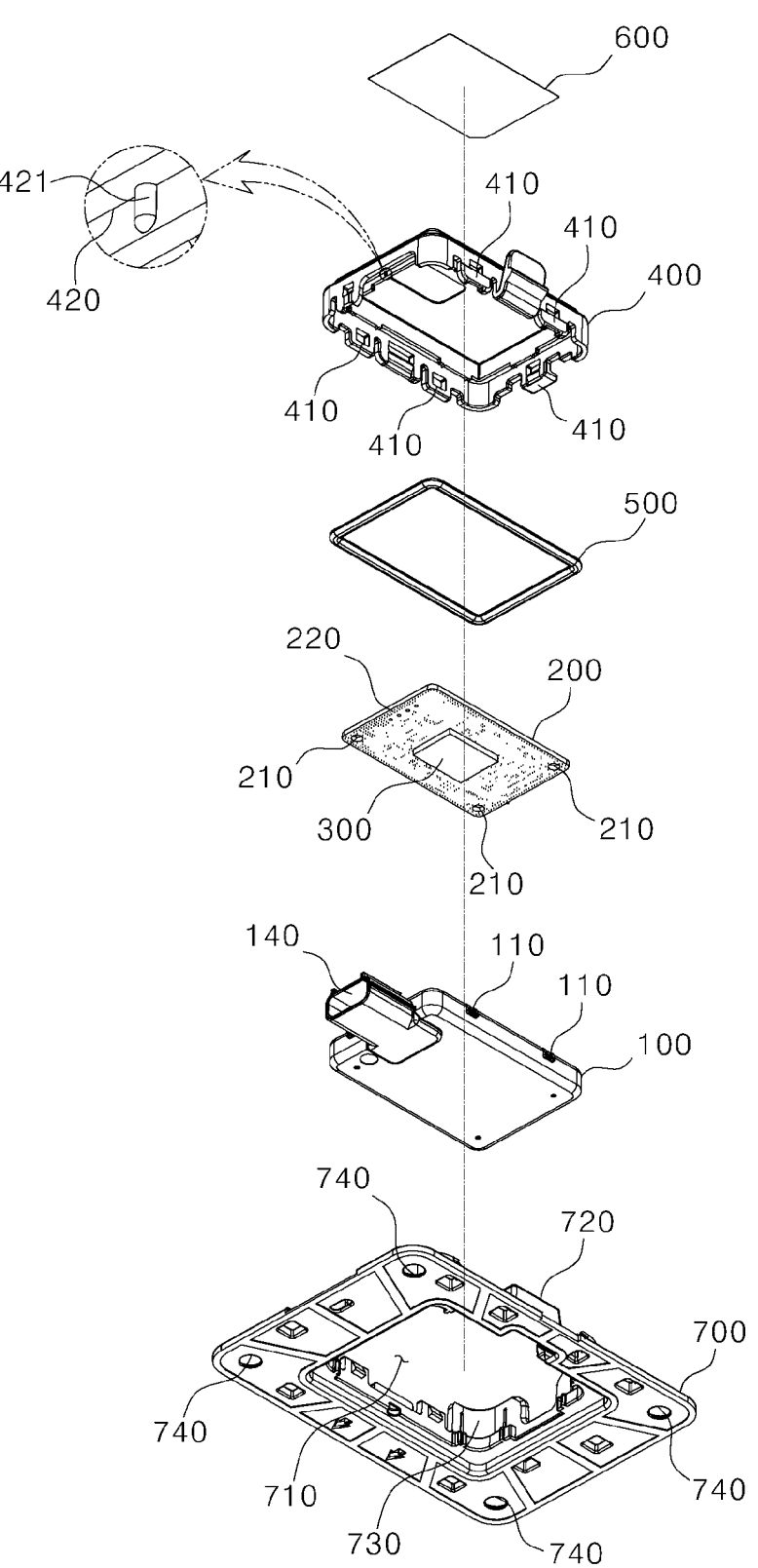
FIG. 3 is an exploded perspective view illustrating the vehicular sensor device according to the embodiment of the present disclosure, when viewed from below.
Figure 4:
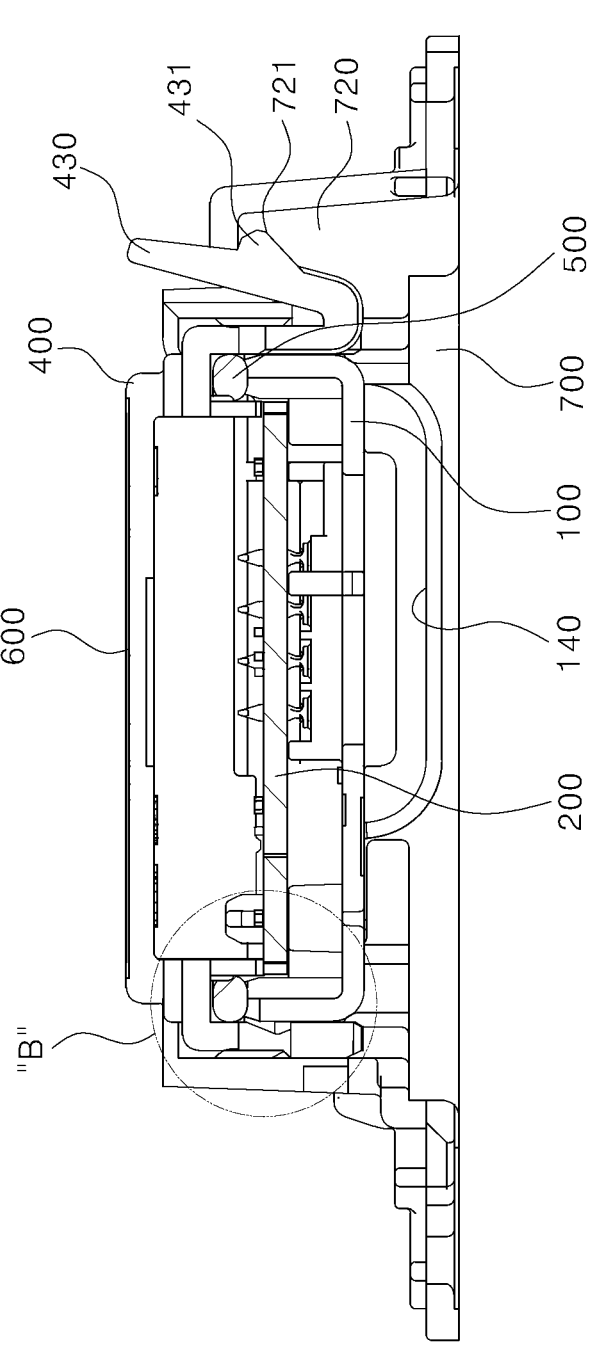
FIG. 4 is a cross-sectional view taken along line A-A on FIG. 1.
Figure 5:
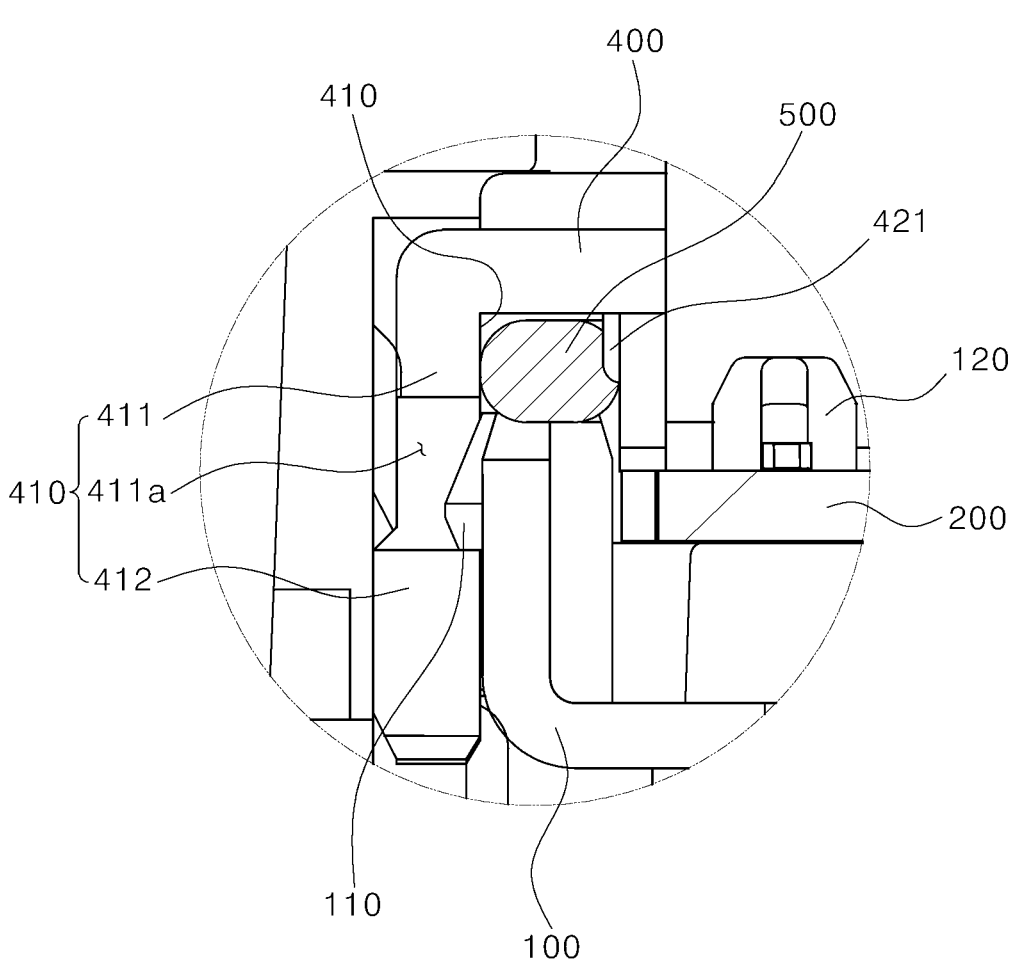
FIG. 5 is an enlarged cross-sectional view illustrating a circular portion "B" of FIG. 4.

FIG. 1 is a perspective view illustrating the vehicular sensor device according to the embodiment of the present disclosure, when viewed from the outside. FIG. 2 is an exploded perspective view illustrating the vehicular sensor device according to the embodiment of the present disclosure, when viewed from above. FIG. 3 is an exploded perspective view illustrating the vehicular sensor device according to the embodiment of the present disclosure, when viewed from below. FIG. 4 is a cross-sectional view taken along line A-A on FIG. 1. FIG. 5 is an enlarged cross-sectional view illustrating a circular part "B" of FIG. 4.

With reference to FIGS. 1 to 5, the vehicular sensor device according to the embodiment of the present disclosure may include a housing 100, a substrate 200, a detector 300, a cover 400, a sealing unit 500. These constituent elements are in detail described as follows.

The housing 100 may be formed to a box-like shape with an internal space inside and has an opening 100a at the upper surface. The housing 100 may be formed of a synthetic resin material, such as plastics. The housing 100 may be manufactured of an electrically insulating material in such a manner as to allow a radio wave to pass through. The housing 100 may be manufactured of a transparent material in such a manner as to allow light to pass through.

The housing 100 may include a hook 110, a connector 140, and a fusion-subject protrusion 120.

The hook 110 may be formed on an outer surface of the housing 100 in a manner that protrudes in the shape of a barb. A plurality of hooks 110 may be arranged along a circumference of the housing 100 in such a manner as to be spaced apart from each other.

The connector 140 may be protrusively formed on one outer surface of the housing 100. The connector 140 may be electrically connected to an electric power supply harness through which electric power for driving an electric motor is supplied from a generator, a battery, or a fuel cell in a vehicle, and may electrically connected to a harness for transmitting and receiving a signal to and from vehicular control units, such as an ECU.

The fusion-subject protrusion 120 is formed on an inner side of the housing 100. A plurality of fusion-subject protrusions 120 may be arranged on the housing 100 and may be formed on a bottom surface of the housing 100 in a manner that protrudes upward.

The hook 110, the connector 140, and the fusion-subject protrusion 120 may be integrally formed on the housing 100. In other words, the housing 100, the hook 110, the connector 140, and the fusion-subject protrusion 120 may be formed by injection molding.

A connection pin 130 that is electrically connected to the connector 140 may be provided on the housing 100. The connection pin 130 may be formed of a metal material. A plurality of connection pins 130 may be provided on an inner bottom surface of the housing 100. The connection pin 130 may be integrally formed with the housing 100. In other words, the connection pin 130 may be formed on the housing 100 by injection molding.

The substrate 200 is accommodated inside the housing 100. A coupling hole 210 and a connection hole 220 may be formed in the substrate 200. The coupling hole 210 may be positioned at an edge, corresponding to the fusion-subject protrusion 120, of the substrate 200. The coupling hole 210 may be formed in the substrate 200 in a manner that passes therethrough in the upward-downward direction. The fusion-subject protrusion 120 may pass through the coupling hole 210 in the substrate 200 in the upward direction, and the fusion-subject protrusion 120 may be fused. As a result, the substrate 200 may be fused to the housing 100 by a laser.

The connection hole 220 may be provided in a one-side edge, corresponding to the connection pin 130, of the substrate 200. The connection hole 220 may be formed in the substrate 200 in a manner that passes therethrough in the upward-downward direction. The connection pin 130 may pass through the connection hole 220 in the upward direction, and the connection pin 130 may come into contact with an inner surface of the connection hole 220. As a result, the substrate 200 may be electrically connected to the connection pin 130.

The detector 300 is mounted on the substrate 200. The detector 300 may be surface-mounted on an outer bottom surface, facing toward the housing 100, of the substrate 200. The detector 300 may be a radar sensor or a camera sensor. In a case where the detector 300 that is mounted on the substrate 200 is the radar sensor, the housing 100 may be formed of an electrically insulating material. In a case where the detector 300 that is mounted on the substrate 200 is the camera sensor, the housing 100 may be formed of a transparent material.

The cover 400 is coupled to the housing 100. The cover 400 covers the opening 100a in the housing 100. The cover 400 and the housing 100 are coupled to each other in such a manner as to be stacked on top of each other in the upward and downward direction. The housing 100 and the cover 400 are removably coupled to each other.

A coupler 410 and a seating part 420 may be provided on the cover 400. The hook 110 is coupled to the coupler 410 by being inserted thereinto. The coupler 410 may be integrally formed with the cover 400. The cover 400 may be formed with the coupler 410 by injection molding. When the hook 110 is coupled to the coupler 410 by being inserted thereinto, the coupler 410 may be elastically transformed.

The coupler 410 may include a coupling body 411 and a blocking portion 412.

The coupling body 411 may be provided on an edge, corresponding to the hook 110, of the cover 400. The coupling body 411 may be formed on the edge of the cover 400 in a manner that protrudes therefrom in the downward direction. A plurality of coupling bodies 411 may be arranged along the edge of the cover 400 in such a manner as to be spaced apart from each other. A through-hole 411a may be formed in the coupling body 411. The through-hole 411a may be formed in the coupling body 411 in a manner that passes therethrough. The hook 110 is inserted into the through-hole 411a.

The blocking portion 412 may be formed on the coupling body 411 in a manner that extends therefrom. The blocking portion 412 may be provided on the bottom of the coupling body 411. A lower end part of the hook 110 that is inserted into the through-hole 411a is seated on the blocking portion 412. In other words, a barb of the hook 110 is hooked onto the blocking portion 412, and thus the hook 110 is prevented from being separated in the downward direction from the coupling body 411.

The seating part 420 is formed in an inner surface of the cover 400 by recessing thereinto. In other words, the seating part 420 is formed along an outer bottom-surface edge, facing toward the housing 100, of the cover 400 The sealing unit 500 is seated on an inner side of the seating part 420.

The cover 400 may further include a first coupling member 430. The first coupling member 430 may be formed integrally on an outer surface of the cover 400. The first coupling member 430 may be formed integrally with the cover 400 by injection molding. The first coupling member 430 may be formed in a manner that is bent in the shape of approximately the letter "U" in the upward direction. The first coupling member 430 may be elastically transformed. A blocking protrusion 431 may be protrusively formed on an outer surface of the first coupling member 430.

The sealing unit 500 is arranged between the cover 400 and the housing 100. The sealing unit 500 may be coupled to seating part 420 by being inserted thereinto.

The sealing unit 500 may be formed of an elastic material, such as rubber or silicone. The sealing portion 500 has a hardness level ranging from 50 to 70 degrees, as a physical property. The sealing unit 500 may be formed in the shape of a hollow ring. The sealing unit 500 may be pressed between the seating part 420 and an upper edge of the housing 100 in an overlapping manner. In other words, the sealing unit 500 is evenly pressed in all directions by an inner surface of the seating part 420 and the upper edge of the housing 100. As a result, a uniform load is applied to the sealing unit 500, thereby increasing the expected lifetime of the sealing unit 500.

A rib 421 may be additionally protrusively formed on the seating part 420. A plurality of ribs 421 may be arranged along a surface of the seating part 420 in such a manner as to be spaced apart from each other. The rib 421 presses against the sealing unit 500 that is seated on the inner side of the seating part 420 and thus fixes the sealing unit 500 to the seating part 420, thereby preventing the sealing unit 500 from being separated from the cover 400.

The vehicular sensor device may further include a label 600, and a base plate 700. The label 600 is provided on an outer surface of the cover 400. The label may be attached on an upper surface of the cover 400. A trademark, a product name, a serial number, specifications, and the like may be printed on a surface of the label 600.

The housing 100 is seated on the base plate 700. The base plate 700 may be coupled to the cover 400 coupled to the housing 100.

A second coupling member 720 that is coupled to the first coupling member 430 may be provided on the base plate unit 700. The second coupling member 720 may be integrally formed with the base plate 700. The second coupling member 720 may be protrusively formed on one side of an upper surface of the base plate 700.

A blocking groove 721 may be formed in an inner surface, facing toward a center part of the base plate 700, of the second coupling member 720. The blocking groove 721 may be formed in an inner surface of the second coupling member 720 by recessing thereinto. When the first coupling member 430 and the second coupling member 720 are coupled, the blocking protrusion 431 is hooked onto an inner side of the blocking groove 721.

A central hole 710 may be formed in the base plate 700. The central hole 710 may be formed in a center part of the base plate 700 in a manner that passes therethrough in the upward-downward direction. This configuration ensures that a bottom side of the housing 100, when seated on the base plate 700 remains uncovered. A detection area that the detector 300 detects through the central hole 710 is formed.

A plurality of supports 730 may be integrally formed on the upper surface of the base plate 700 in such a manner as to be spaced apart from each other along an edge of the central hole 710. The support 730 may support the outsides of the housing 100 and the cover 400 in a manner that surrounds the housing 100 and the cover 400 that are seated on the base plate 700 and are coupled to the base plate 700.

A fastening hole 740 may be formed in the base plate 700. The fastening hole 740 may be formed in an edge of the base plate 700 in a manner that passes therethrough in the upward-downward direction. A fastening member, such as a bolt or a screw, passes through the fastening hole 740 in the upward direction and is fastened to a ceiling of the inside of the vehicle. Thus, the base plate 700 may be assembled to the ceiling of the inside of the vehicle.

The vehicular sensor device according to the embodiment of the present disclosure includes the housing 100 and the cover 400 that are coupled in a snap-fit coupling manner instead of in a bolt fastening manner. As a result, as many bolts and nuts that are necessary in the related art are not used. Manufacturing costs and work-hours can be reduced when compared to fastening performed using a bolt in the related art.

The vehicular sensor device according to the embodiment of the present disclosure includes the housing 100 and the cover 400 assembled together with the sealing unit 500 in the shape of an O-ring interposed between them instead of using a gasket as in the related art. The sealing unity 500 is pressed in all directions, thereby relieving local stress thereon and increasing the expected lifetime thereof for waterproofing.

The embodiment of the present disclosure is described only in an exemplary manner with reference to the drawings. It would be understandable to a person of ordinary skill in the art to which the present disclosure pertains that various modifications may possibly be made to the embodiment and that various equivalents thereof may possibly be implemented. Therefore, the legitimate technical scope of the present disclosure should be defined by the following claims.

What is claimed is:

1. A vehicular sensor device comprising:
a housing having an opening and having an internal space inside of the housing;
a substrate accommodated inside the housing;
a detector mounted on the substrate;
a cover coupled to the housing and covering the opening; and
a sealing unit arranged between the cover and the housing,
wherein one or more fusion-subject protrusions protrude upward on the housing, and one or more coupling holes of the substrate are positioned corresponding to the one or more fusion-subject protrusions, and
wherein the one or more fusion-subject protrusions pass through the one or more coupling holes of the substrate and are melted to connect the substrate to the housing.

2. The vehicular sensor device of claim 1, wherein one or more hooks are protrusively formed on an outer surface of the housing, and one or more couplers are coupled to the cover by being inserted thereinto.

3. The vehicular sensor device of claim 2, wherein the coupler comprises:
a coupling body in which a through-hole into which the hook is inserted is formed, the coupling body provided on an edge of the cover; and
a blocking portion onto which the hook inserted into the through-hole is hooked, the blocking portion being provided on one side of the coupling body.

4. The vehicular sensor device of claim 2, wherein a plurality of hooks are arranged along a circumference of the housing, and a plurality of couplers are arranged along a circumference of the cover.

5. The vehicular sensor device of claim 1, wherein the detector is a radar sensor or a camera sensor.

6. The vehicular sensor device of claim 1, wherein a seating part is formed along an edge of an inner surface of the cover by recessing thereinto, and the sealing unit is seated on an inner side of the seating part.

7. The vehicular sensor device of claim 6, wherein the sealing unit is O-ring formed of an elastic material in a shape of a ring.

8. The vehicular sensor device of claim 7, wherein the sealing unit is pressed between the seating part and an edge of the housing.

9. The vehicular sensor device of claim 8, wherein one or more ribs are protrusively formed on a surface of the seating part to press against the sealing unit.

10. The vehicular sensor device of claim 9, wherein a plurality of ribs are arranged along the surface of the seating part.

11. The vehicular sensor device of claim 1, further comprising:

a label attached on an outer surface of the cover; and a base plate having a central hole, the housing seated on the base plate and the base plate coupled to the cover.

* * * * *